(12) United States Patent
Cofino et al.

(10) Patent No.: US 6,288,629 B1
(45) Date of Patent: *Sep. 11, 2001

(54) METHOD OF USING WRITE_OK FLAG FOR RADIO FREQUENCY (RF) TRANSPONDERS (RF TAGS)

(75) Inventors: Thomas Anthony Cofino, Rye; Daniel Joseph Friedman, Tarrytown, both of NY (US); Kenneth Alan Goldman, Norwalk, CT (US); Harley Kent Heinrich, Brewster, NY (US)

(73) Assignee: Intermec IP Corp., Woodland Hills, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/862,913

(22) Filed: May 23, 1997

(51) Int. Cl.[7] .............................. H04B 7/00; G01S 13/74
(52) U.S. Cl. ................... 340/10.1; 340/505; 340/572.1; 342/41; 342/42; 342/50; 342/51
(58) Field of Search ............................... 340/825.54, 505, 340/568, 572, 573; 342/41, 42, 50, 51

(56) References Cited

U.S. PATENT DOCUMENTS

| 5,440,302 |   | 8/1995 | Irmer et al. . |
|---|---|---|---|
| 5,517,194 | * | 5/1996 | Carroll et al. .......................... 342/50 |
| 5,521,590 |   | 5/1996 | Hanaoka et al. . |
| 5,712,630 | * | 1/1998 | Nanboku et al. ............... 340/825.54 |

* cited by examiner

Primary Examiner—William A. Cuchlinski, Jr.
Assistant Examiner—Yonel Beaulieu
(74) Attorney, Agent, or Firm—O'Melveny & Myers LLP

(57) ABSTRACT

A method of sending data from a base station to a passive RF tag and writing the data to a tag non-volatile memory which detects a "partial write", where the tag voltage falls during the write process under the voltage sufficient to reliably write the tag non-volatile memory, is presented. The tag voltage is compared to a stable reference voltage during the time the tag memory is being written, and if the tag voltage falls below an acceptable level, a flag in the tag non-volatile memory is cleared.

39 Claims, 6 Drawing Sheets

METHOD OF USING WRITE_OK FLAG FOR RADIO FREQUENCY (RF) TRANSPONDERS (RF TAGS)

FIELD OF THE INVENTION

The field of the invention is the field of Radio Frequency (RF) Transponders (RF Tags), wherein a Base Station sends power and information to one or more RF Tags which contain logic and memory circuits for storing information about objects, people, items, or animals associated with the RF Tags. The RF Tags can be used for identification and location (RFID Tags) of objects and to send information to the base station by modulating the load on an RF Tag antenna.

BACKGROUND OF THE INVENTION

RF Tags can be used in a multiplicity of ways for locating and identifying accompanying objects, items, annims, and people, whether these objects, items, animals, and people are stationary or mobile, and transmitting information about the state of the of the objects, items, animals, and people. It has been known since the early 60's in U.S. Pat. No. 3,098,971 by R. M. Richardson, that electronic components on a transponder could be powered by radio frequency (RF) power sent by a "base station" at a carrier frequency and received by an antenna on the tag. The signal picked up by the tag antenna induces an alternating current in the antenna which can be rectified by an RF diode and the rectified current can be used for a power supply for the electronic components. The tag antenna loading is changed by something that was to be measured, for example a microphone resistance in the cited patent. The oscillating current induced in the tag antenna from the incoming RF energy would thus be changed, and the change in the oscillating current would lead to a change in the RF power radiated from the tag antenna. This change in the radiated power from the tag antenna can be picked up by the base station antenna and thus the microphone would in effect broadcast power without itself having a self contained power supply. In the cited patent, the antenna current also oscillates at a harmonic of the carrier frequency because the diode current contains a doubled frequency component, and this frequency can be picked up and sorted out from the carrier frequency much more easily than if it were merely reflected. Since this type of tag carries no power supply of its own, it is called a "passive" tag to distinguish it from an active tag containing a battery. The battery supplies energy to run the active tag electronics. An active tag may also change the loading on the tag antenna for the purpose of transmitting information to the base station, or it may act as a transmitter to broadcast the information from the tag antenna directly to the base station.

The "rebroadcast" of the incoming RF energy at the carrier frequency is conventionally called "back scattering", even though the tag broadcasts the energy in a pattern determined solely by the tag antenna and most of the energy may not be directed "back" to the transmitting antenna.

In the 70's, suggestions to use tags with logic and read/write memories were made. In this way, the tag could not only be used to measure some characteristic, for example the temperature of an animal in U.S. Pat. No. 4,075,632 to Baldwin et. al., but could also identify the animal. The antenna load was changed by use of a transistor.

Prior art tags have used electronic logic and memory circuits and receiver circuits and modulator circuits for receiving information from the base station and for sending information from the tag to the base station.

U.S. Pat. No. 5,214,410, hereby incorporated by reference, teaches a method for a base station to communicate with a plurality of Tags.

Prior art tags typically use a number of discrete components connected together with an antenna. However, to substantially reduce the cost of the tags, a single chip connected to an antenna must be used.

The environment of RF tags is such that the power transferred to the tags may vary because the tag is moving with respect to the base station or because other sources of interference are changing while the base station is trying to write information to the non-volatile tag memory. Typically, the information is written a single byte at a time. The tag voltage is assumed to be high enough to write to the $E^2PROM$ memory elements during the entire time the byte is being written to memory. However, if the voltage is not high enough, not enough charge will be stored in the $E^2PROM$ memory elements. Enough charge may be stored that the base station writing the memory can call for a read back of the memory that was just written, and the read back data will be correct. However, if the tag is moved to another location, the same or another base station may read the memory and get a different result if not enough charge is stored in the $E^2PROM$ memory elements.

RELATED APPLICATIONS

Copending patent applications assigned to the assignee of the present invention and hereby incorporated by reference, are identified as follows:

Ser. No. 08/303,965 filed Sep. 9, 1994 entitled RF Group Select Protocol, by Cesar et al., (now U.S. Pat. No. 5,673,037, issued Sep. 30, 1997);

Ser. No. 08/304,340 filed Sep. 9, 1994 entitled Multiple Item RF ID Protocol, by Chan et al., (now U.S. Pat. No. 5,550,547, issued Aug. 27, 1996);

Ser. No. 08/521,898 filed Aug. 31, 1995 entitled Diode Modulator for RF Transponder by Friedman et al., (now U.S. Pat. No. 5,606,323, issued Feb. 25, 1997).

Application submitted Aug. 9, 1996 entitled RFID System with Broadcast Capability by Cesar et al., Application No. 08/694,606 filed Aug. 9, 1996, (now U.S. Pat. No. 5,942,987 issued Aug. 24, 1999); and Application submitted Jul. 29, 1996 entitled RFID Transponder with Electronic Circuitry Enabling and Disabling Capability, by Heinrich et al., Application No. 08/681,741 filed Jul. 29, 1996, (now U.S. Pat. No. 5,874,902 issued Feb. 23, 1999).

SUMMARY OF THE INVENTION

A field in the volatile memory of an RF tag is defined as a "write-OK" flag. This field may consist of multiple bits, which can define multiple states, or it may consist of only a single bit, which can be in a first state or a second state. It may consist of a latch. When the tag first powers up in the field of a base station, the "write-OK" flag is cleared or set to the second state. When a base station wants to send data for a tag to write to memory, the base station or the tag first sets the "write-OK" flag to the first state. After the flag has been set, the base station then starts the "write to memory" procedure. During the entire "write to memory" procedure, the tag measures the tag voltage. If a determined percentage of the tag voltage falls below a stable reference voltage, the tag clears the "write-OK" flag, (i.e. sets the flag to the second state). After the data has been written to memory, the tag or the base station can check whether the "write-OK" flag is still set, and if the "write-OK" flag is still set, the data in the memory can be trusted.

DETAILED DESCRIPTION OF THE INVENTION

Figure 1:
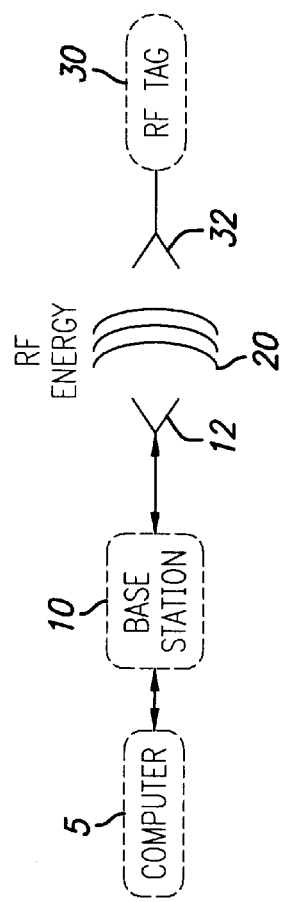
FIG. 1 is a sketch of a system of base station and RF tag.

The problem solved by the present invention is that the voltage induced on a passive RF tag by broadcast of RF power may be high enough to run the tag electronics, but not be high enough or last long enough to reliably write to the non-volatile tag memory. (The non-volatile memory requires considerably higher voltage to write than is needed for the tag electronics.) Not enough charge will be stored in $E^2PROM$ memory elements used for the non-volatile memory in some RE tags. Enough charge may be stored that the base station writing the memory can call for a read back of the memory that was just written to check that the memory was correctly written, and the read back data will be correct. However, if the tag is moved to another location, the same or another base station may read the memory and get a different result it not enough charge is stored in the $E^2PROM$ memory elements. The data retention over time may be compromised, and temperature variations may change the apparent data in the tag non-volatile memory. The problem solved was not apparent until tests were run which included writing the tag non-volatile memory at long range. In the field, it was found that the tag non-volatile memory could apparently be written, and the data checked out when the tag was commanded to read the data back to the base station, but when the tag was moved with respect to the base station, the information stored in the tag non-volatile memory apparently changed. There could be enough charge stored to give correct readings under some conditions, but not all.

The solution to the problem is to provide apparatus to measure the supply voltage during the "write" phase of the command protocol for RF tags. The preferred embodiments of the invention compare the supply voltage VDD on the chip, which varies with the distance and orientation between the tag and the base station, to the output of a stable reference voltage generator. This stable voltage reference generator is a bandgap voltage generator in the most preferred embodiment of the invention. However, any stable reference voltage which does not drift too much as VDD drifts could also be used. The bandgap reference voltage is, however, temperature compensated and has excellent stability compared with other possible reference voltage circuits such as a diode drop or an n-channel FET threshold Voltage circuit. (One such a voltage is provided by a well known current mirror source already present on the tag and used for other purposes. An n-type transistor (n-mirror voltage source) produces a voltage VNMR which is relatively stable with respect to ground, and vanes relatively little as VDD varies.) It will be apparent to one skilled in the art that other methods of measuring the tag supply voltage other than comparing the supply voltage to a voltage reference could also be implemented. For example, a tag voltage controlled oscillator frequency could be compared with another frequency standard on the tag or a frequency broadcast to the tag.

If a defined percentage of the tag supply voltage VDD is sufficiently high with respect to a threshold voltage related to the output of the bandgap reference generator at the beginning of the write phase, a flag (WRITE_OK flag) is preferably set in the volatile memory of the tag, which is defined to be in the tag logic section 42 in this application. The threshold will typically be equal to the output voltage of the bandgap reference generator, but may be less than or greater than the output of the bandgap reference generator. The volatile memory may be written by any voltage which will run the tag electronics. The WRITE_OK flag can be read by the tag logic section 42. Then, if VDD drops below the threshold at any time during the write cycle, the tag clears the WRITE_OK flag. When the base station checks the tag non-volatile memory that has just been written (VERIFY command), the WRITE_OK flag is also checked. If the WRITE_OK flag is cleared, the base station knows that the memory has not been correctly written, and can take further action.

FIG. 1 shows a system of a base station 10 having an associated computer 5 sending RF energy 20 from base station antenna 12 to a tag antenna 32 associated with an RF tag 30. The RF frequency $f_0$ is preferably above 1 kHz, more preferably above 100 MHZ, even more preferably above 900 MHZ, and most preferably above 2,300 MHZ. To send information from the base station to the tag the RF signal is preferably amplitude modulated at a frequency $f_1$ greater than 1 kHz, more preferably between 5 and 150 kHz, and most preferably between 20 and 60 kHz. However, the RF signal may also be modulated by frequency modulation or by phase modulation methods, as is well known in the art of RF signal propagation. To send information from the tag to the base station, the tag changes the loading on the tag antenna 32 to change the antenna reflectivity and thus communicate with the base station 10.

Figure 2:
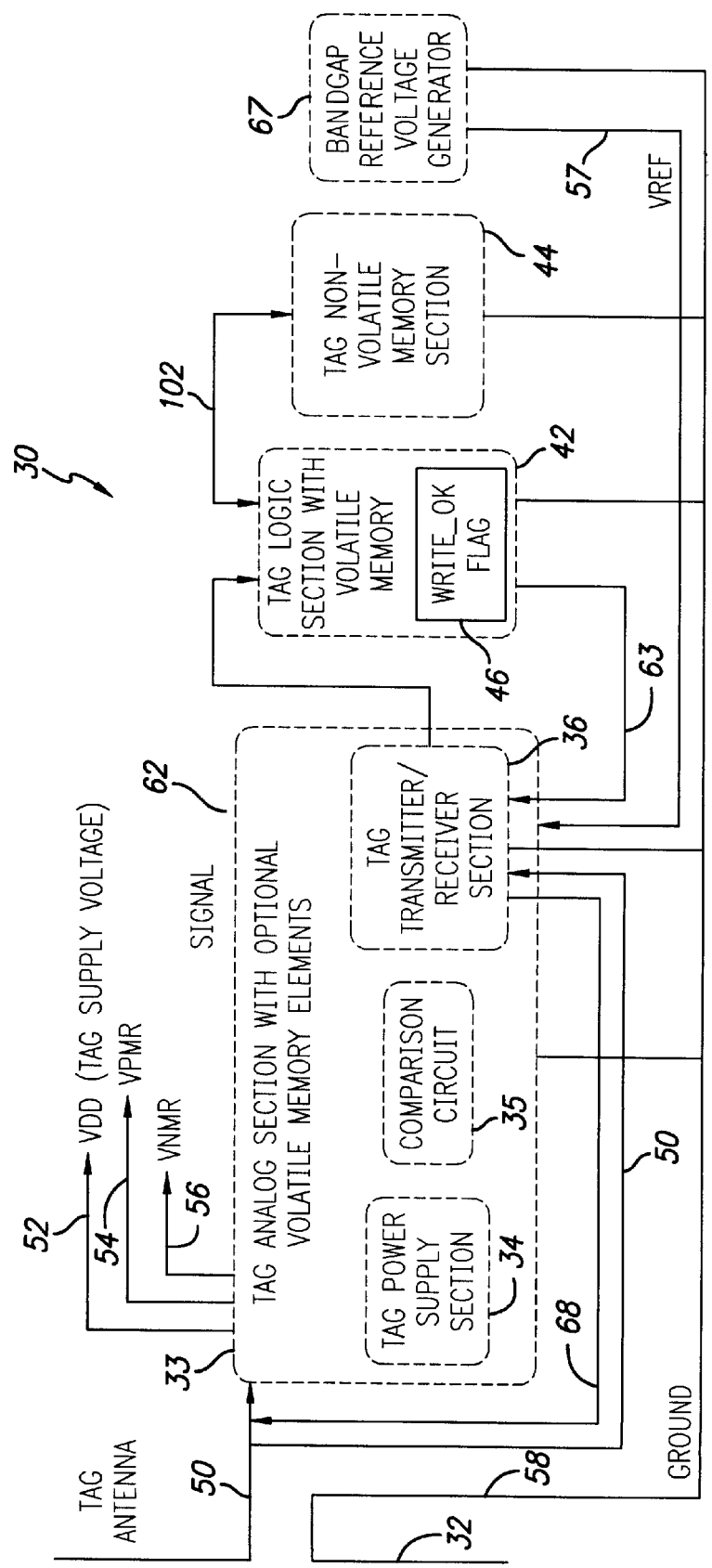
FIG. 2 is a block diagram of an RF tag.

FIG. 2 shows a block diagram of the tag antenna 32 and part of the RF tag 30. The RF antenna 32 feeds RF power to the tag analog section 33 which contains the tag power section 34. In an active tag, the tag power section 34 contains a battery. In a passive tag, the only power source for the tag electronics is the RF power sent to the tag from the base station. In the embodiment shown in FIG. 2, a tag rectification signal transmitter/receiver section 36 comprising an RF diode, a signal capacitor, and a signal capacitor current drain is part of the tag analog section 33, but separate from the tag rectification power supply 34, but the invention is also contemplated in the case that section 36 is part of the tag power supply 34. The tag power section 34 supplies current at a supply voltage VDD, and control voltages VPMR, and VNMR on lines 52, 54, and 56 respectively. These lines are used to power and control the various devices on the tag. VPMR and VNMR are voltages related to VDD and the ground potential respectively by well known current mirror circuit techniques using p-type and n-type transistors respectively. In a preferred embodiment, the RF antenna 32 has two connections to the tag 30, denoted here by lines 50 and 58. Line 58 is the conventional ground. Other preferred embodiments have a capacitor attached to one terminal of the antenna.

The tag receiver/transmitter section 36 receives an RF signal which is preferably amplitude modulated at a frequency $f_1$ from the antenna 32 over line 50, and rectifies and demodulates the RF signal and delivers a digital signal to the rest of the tag electronics over line 62.

The tag receiver/transmitter section 36 communicates data over line 62 with the tag logic section 42. The tag logic section 42 modulates the impedance of the tag antenna 32 using line 63 to the tag receiver/transmitter section 36 and line 68 to the tag antenna 32. The modulation of the antenna impedance changes the backscattered energy from the antenna 32 and transmits signals from the tag to the base station 10.

The tag logic section 42 communicates with the tag non-volatile memory section 44 over line 102. The tag logic section 42 most preferably contains a field 46 in the volatile memory of the tag called a WRITE_OK field. The WRITE_OK field may be a single bit. The WRITE_OK field may optionally be contained in the tag analog section 33 as section of a tag volatile analog memory comprising elements such as capacitive elements.

A tag reference voltage source 67 transmits a voltage VREF to the rest of the tag electronics on line 57. One excellent reference voltage source well known in the electronics art is a bandgap voltage generator. Such a voltage source is, unfortunately, a very high current consuming circuit which would draw more current than the non-writing circuits of the entire single chip RF tag, and it would not be obvious to one of ordinary skill in the art of RF tags that such a device could be used. However, we realized that we only need turn the band gap voltage generator on during the "write to memory" phase of the chip operation, when such a stable VREF is needed for other purposes, so no extra current is demanded by the WRITE-OK apparatus and methods described. Such a bandgap reference voltage generator is the most preferred tag reference voltage source.

The tag analog section 33 contains a circuit 35 for comparing the tag voltage VDD with the output VREF of the bandgap reference generator 67.

Figure 3:
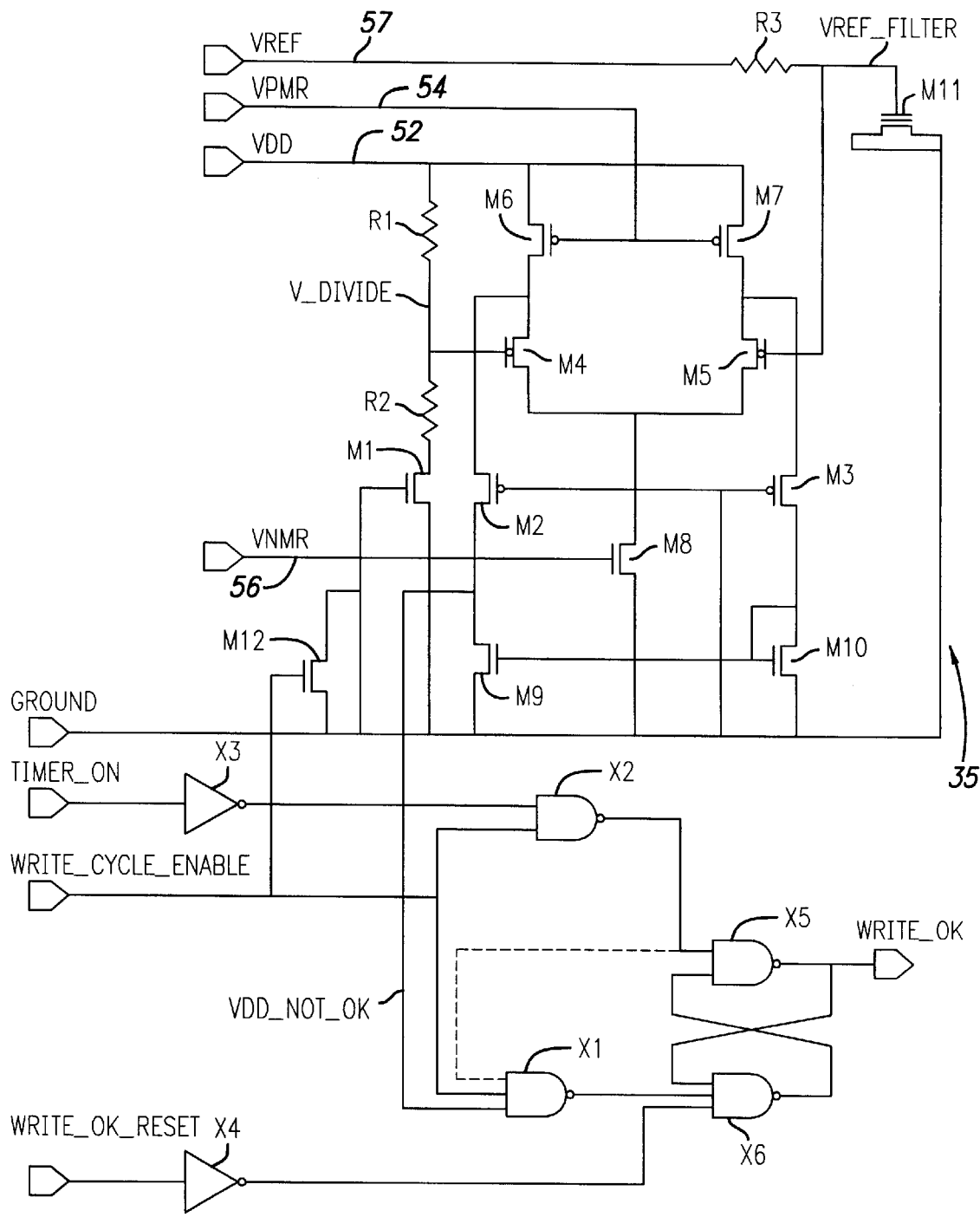
FIG. 3 is a block and circuit diagram of a comparison circuit and WRITE_OK flag.

FIG. 3 is a circuit diagram for an innovative low current voltage comparison circuit which compares the tag voltage VDD with the output VREF of the bandgap reference generator 67. Any stable voltage source which does not fluctuate as much as VDD could be used to generate the reference voltage level.

The innovative circuit shown in FIG. 3 implements the proportionality signal and performs the comparison of VDD to the reference voltage VREF, and generates a latched logic result which can be accessed by the remaining tag electronics. In addition, the circuit shown in FIG. 3 handles startup and reset conditions. The control and output voltage waveforms are shown as a function of time in FIG. 4a–g and FIG. 5a–g.

The resistor string (R1/R2) with innovative enabling transistor (M1) generates a voltage level V_DIVIDE proportional to the supply voltage level VDD. As an example, if we choose a reference voltage VREF of 1 volt, and a supply voltage VDD lower limit for writing of 2 volts, we compare ½ VDD to VREF so we would choose R1=R2. The transistor M1 allows the current draw from the resistor string R1/R2 to be deactivated except during write operations. Transistors M2–M10 form a comparator analogous to a comparator described in U.S. Pat. No. 5,583,425 (herein incorporated by reference) with the p-type and n-type transistors interchanged in a manner well known to one skilled in the art. The comparator inputs are V_DIVIDE and VREF_FILTER. Transistor M12 ensures that the output of the comparator VDD_NOT_OK is low if TIMER_ON is low.

VREF_FILTER is merely VREF, the output of the bandgap reference generator 67, filtered by the optional RC combination R3 and the capacitance of the transistor M11. The output of the bandgap generator may be quite noisy, and in such a case the optional filtering circuit is used. If the optional filtering circuit is not used, VREF is used directly in place of VREF_FILTER.

The comparator output, VDD_NOT_OK, is connected to a 3-input nand gate (X1). The WRITE_OK latch is formed from the cross-coupled nand gates X5 and X6. Inverters X3, X4 and nand gates X1 and X2 are used as control logic for the WRITE_OK latch. The output of the circuit is the signal WRITE_OK. Note that the WRITE_OK signal is latched.

Figure 4:
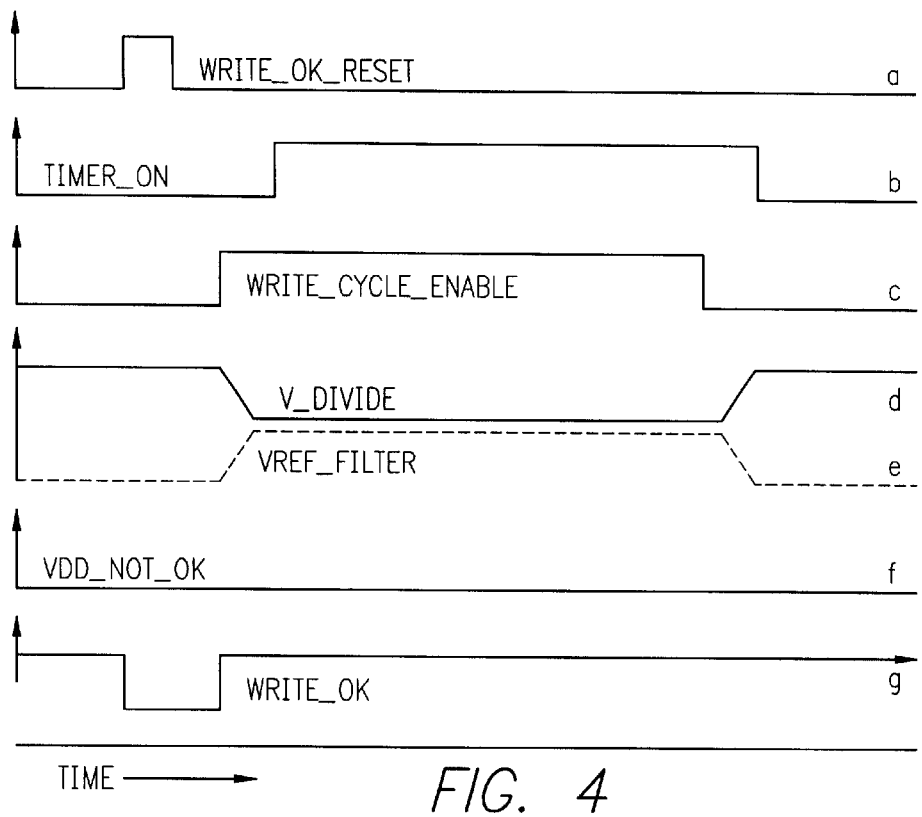
FIG. 4 a–g are sketches of the relevant voltages in FIG. 3 vs time when the tag voltage is sufficient to reliably write the tag non-volatile memory.
Figure 5:
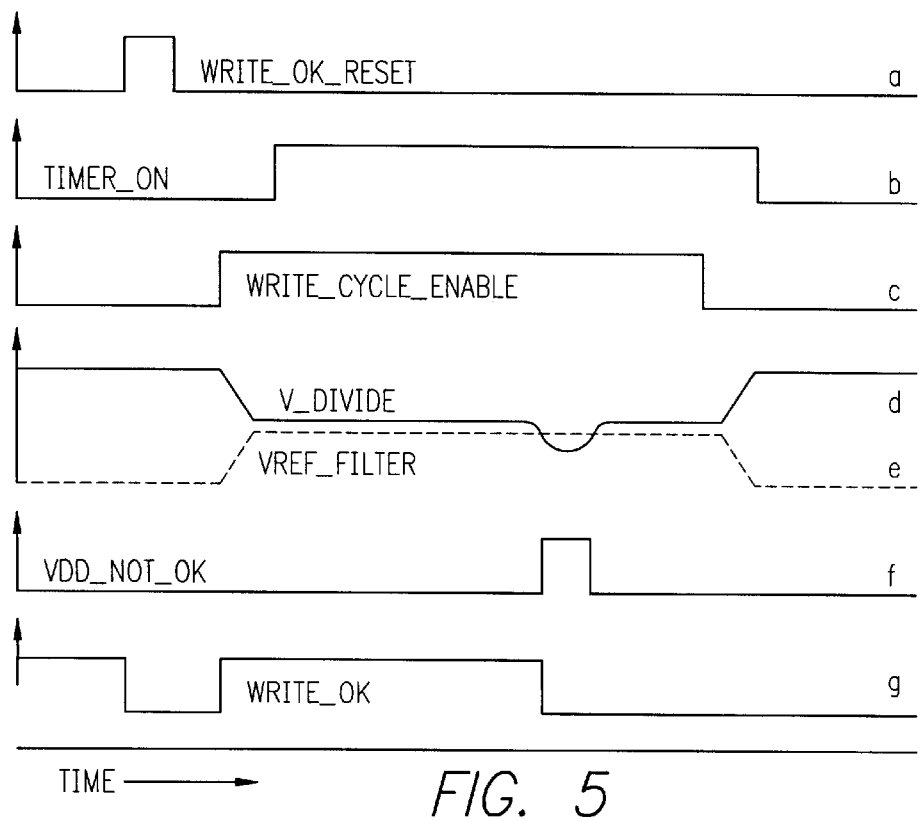
FIG. 5 a–g are sketches of the relevant voltages in FIG. 3 vs time when the tag voltage becomes insufficient to reliably write the tag non-volatile memory.

When the tag frst powers up, a reset signal is generated, as shown in FIG. 4a and FIG. 5a. This signal is fed to the WRITE_OK circuit of FIG. 3 as the WRITE_OK_RESET signal. Note that driving this igwal high forces the WRITE_OK output line low, as shown in FIG. 4g and 5g. Thus, tags enter the field with the WRITE_OK flag indicating a failed write (which prevents a weak write from being missed because the tag powered down and then back up before a weak write check was made).

The tag generates a control signal, here called WRITE_CYCLE_ENABLE, to start the wrte process, as shown in FIG. 4c and FIG. 5c. Another signal on the chip which has the correct timing relation is available, and used in the circuit of FIG. 3. It is the TIMER_ON signal which is high throughout the actual writing of the $E^2$-PROM memory elements of the tag non-volatile memory section 44. These control signals could be generated separately on the chip, but they are already available for other purposes and thus less expensive. Other control signals with the correct timing could also be used by one of skill in the art. As shown in FIG. 4b and 5b, TIMER_ON is delayed by several microseconds with respect to WRITE_CYCLE_ENABLE (FIG. 4c and 5c). Assuming there is no reset event, when TIMER_ON is low and WRITE_CYCLE_ENABLE is high, WRITE_OK is set high. This initializes the WRITE_OK flag high (i.e. the supply voltage is good) at the beginning of each write.

One optional method of introducing more delay into the TIMER_ON signal to the nand gate X2 is to connect an even number of additional inverters in series in the line connecting X3 and X2 just before X2.

If during the write process the supply voltage VDD stays above the acceptable level so that V_DIVIDE (FIG. 4d) does not drop under VREF_FILTER (FIG. 4e), the VDD_NOT_OK signal will not transition high and the WRITE_OK output remains high during and after the write event.

If at any time during the write process the supply voltage VDD shown drops below the acceptable level so that V_DIVIDE (FIG. 5d) drops under VREF_FILTER (FIG. 5e), the VDD_NOT_OK signal (FIG. 5f) will transition high which, in turn, sets the WRITE_OK (FIG. 5g) output low. The WRITE_OK output is available for use by the rest of the tag integrated circuit electronics following the write operation.

Figure 6:
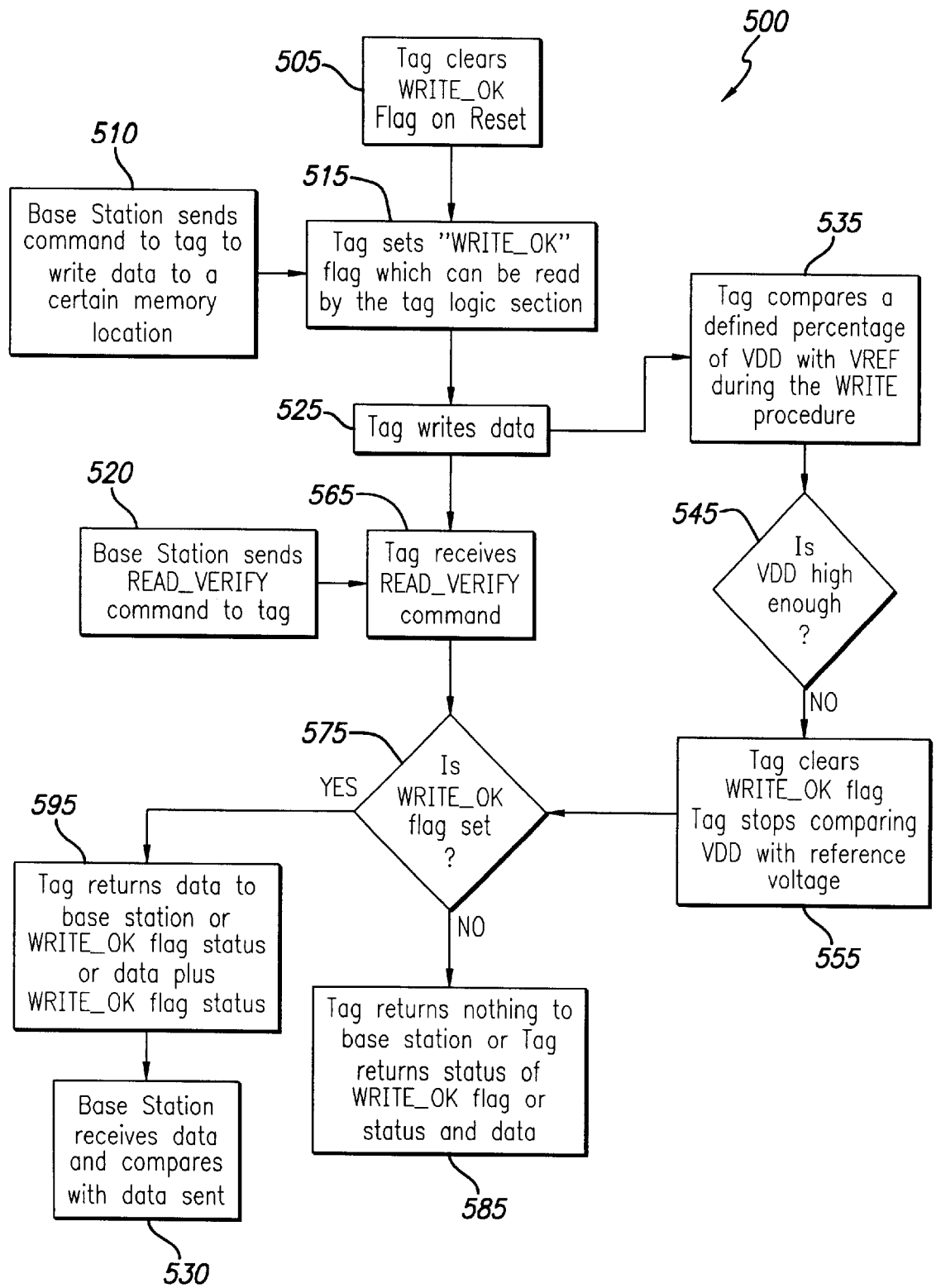
FIG. 6 is a flow chart of a method of using the invention.

The WRITE_OK output of FIG. 3 is used in the method of the invention. One preferred embodiment of the invention is outlined in the flow chart 500 of FIG. 6. As a tag or tags power up in the field of the base station, a number of control signals are sent out by the tag electronics to initialize the settings in the volatile memory of the tag. One of these signals is used to reset, or clear, the WRITE_OK flag in step 505. At a later time, the base station sends a command to the tag to write data to a certain memory location in step 510. The base station may send the command by itself, and send the data in another transmission, or the base station may send, in a single transmission, the command plus the data to be written. The tag receives the command, and sets the WRITE_OK flag in step 515. The tag then writes the data to the tag non-volatile memory section 44 in step 525. Meanwhile, the tag is continually comparing the tag voltage VDD to the stable tag reference voltage VREF in step 535, and if VDD falls below an acceptable level, the tag decides in step 545 to clear the WRITE_OK flag in step 555. After the tag has had enough time to write the data, the base station sends a READ_VERIFY command to the tag in step 520. The tag receives the READ_VERIFY command in step 565, and checks whether the WRITE_OK flag is set. If the WRITE_OK flag is not set, the decision step 575 sends the system to step 585, and the tag may either send nothing at all to the base station, or may send an error message to the base station, or send both the data together with a status message that the WRITE_OK flag is not set. If the WRITE_OK flag is set, the decision step 575 sends the system to step 595, where the tag returns the data which has just been written to the base station, or the data and the status that the WRITE_OK flag is set, or just the status of the WRITE_OK flag. The base station can then verify that the data was in fact written correctly in step 530.

Figure 7:
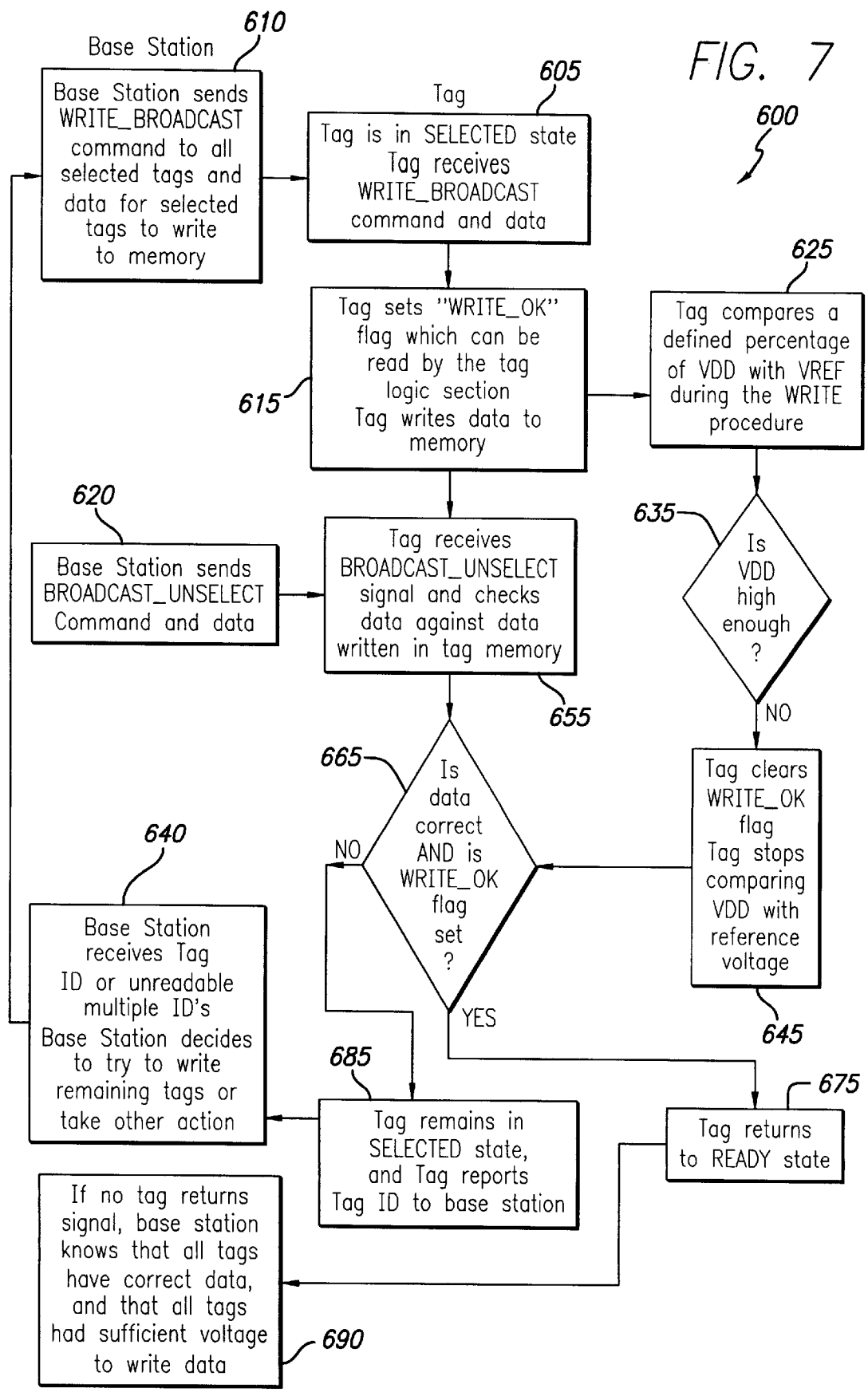
FIG. 7 is a flow chart of a method of using the invention.

A flow chart 600 for an alternative embodiment of the invention is given in FIG. 7. The base station sends a WRITE_BROADCAST command and data to a group of one or more tags in step 610. The WRITE_BROADCAST command is used to send the same data to a group of tags which has been selected on the basis of some attribute, so that all tags write the same data to the tag non-volatile memory. In a previous step, the tags have been selected and moved to the SELECTED state from the READY state that they were in when they were powered up. Each tag in the SELECTED state receives the WRITE_BROADCAST command and data in step 605. Each tag sets the WRITE_OK flag in step 615, and then writes the data to the tag non-volatile memory. During the entire time that a tag is writing the data to memory, each tag compares VDD to VREF in step 625, and if at any time VDD falls below a specified voltage, the decision step 635 sends the tag to the step 645, where the tag clears the WRITE_OK flag. After sufficient time has elapsed for the tags to write the data to the tag memories, the base station sends a BROADCAST_UNSELECT command and the same data which was sent with the WRITE_BROADCAST command to the group of tags in step 620. The tag receives the BROADCAST_UNSELECT command and the same data sent with the WRITE_BROADCAST command, and then in step 655 checks the data against the data which was written to the tag non-volatile memory in step 615. If the data sent with the WRITE_BROADCAST command and the data sent with the BROADCAST_UNSELECT command are identical, and if the WRITE_OK flag is set, the decision step 665 sends the tag to step 675, where the tag returns to the READY state. If either the data do not match, or the WRITE_OK flag is cleared, the tag remains in the SELECTED state, and returns its ID to the base station in step 685. The base station receives zero or more tag ID's in step 640. If no ID's are received, the base station knows that all tags have successfully written the data to the memory, and that the voltage on each tag was sufficient for a good write. If one or more tags return an ID to the base station, the base station will decide to do another write broadcast by returning to step 610 to iterate and write all the tags, or take other further action.

Figure 8:
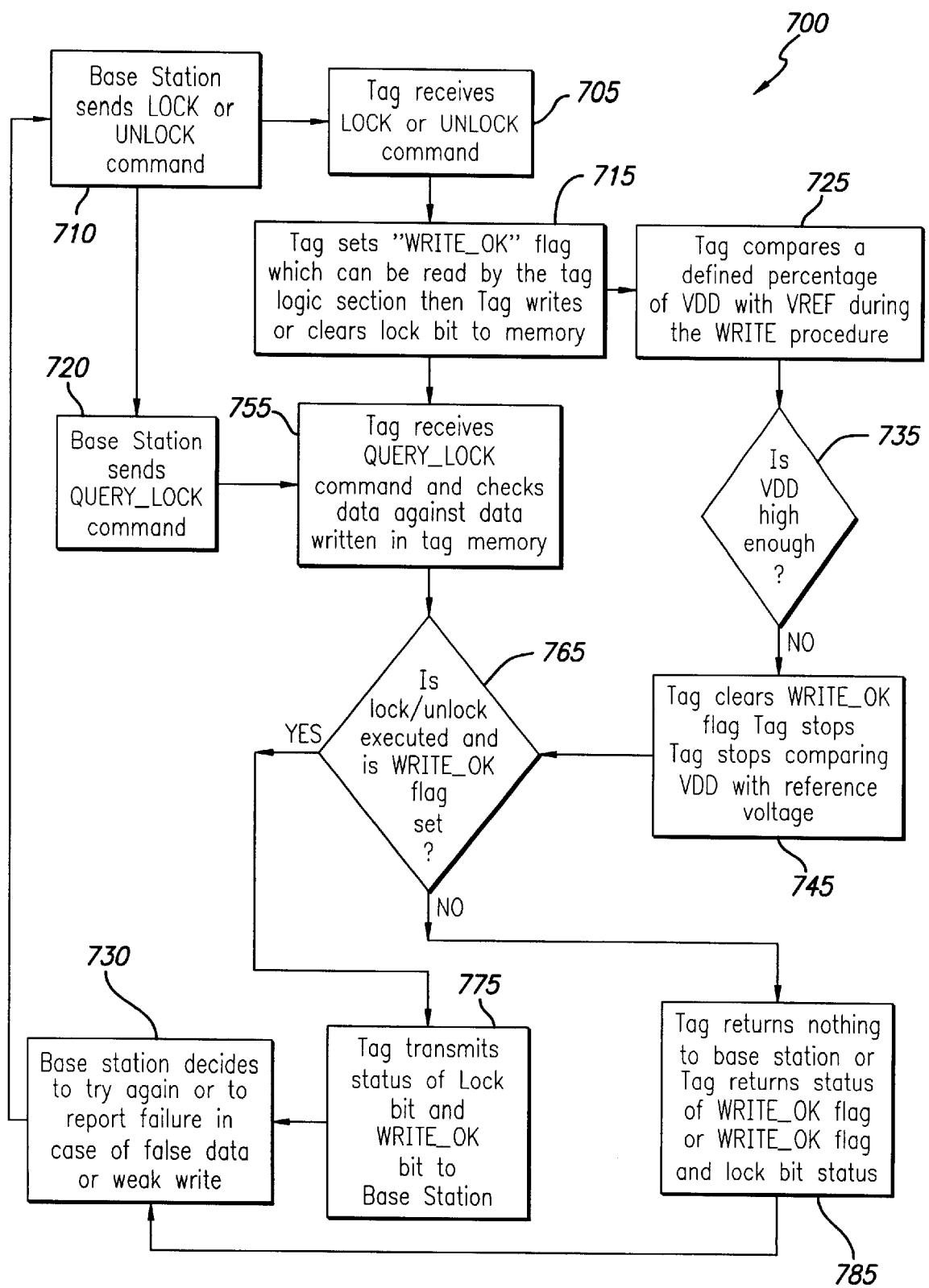
FIG. 8 is a flow chart of a method of using the invention.

A flow chart 700 for an alternative embodiment of the invention is given in FIG. 8. In this case, the base station sends commands to set or clear a "lock bit", which locks or unlocks the memory at a particular address. In step 710, the base station sends the LOCK or UNLOCK command, and the memory address that is to be locked or unlocked. The tag receives the command and the address in step 705, and then sets the WRITE_OK flag and sets or clears the lock bit in step 715. During the entire time that a tag is writing the data to memory, each tag compares VDD to VREF in step 725, and if at any time VDD falls below a specified voltage, the decision step 735 sends the tag to the step 745, where the tag clears the WRITE_OK flag. After sufficient time has elapsed for the tags to set or clear the lock bit, the base station sends a QUERY_LOCK command and the address of the locked or unlocked data to the tag in step 720. The tag receives the QUERY_LOCK command in step 755, and in decision step 765, the tag decides on the basis of whether the lock bit is set or cleared, and whether the WRITE_OK flag is set or cleared, which response to give. The tag sends the status of the lock bit and the WRITE_OK bit in step 775 if the WRITE_OK flag is set. In step 785, the tag may return no signal if the WRITE_OK flag is cleared, or it may return the status of the lock bit and the status of the WRITE_OK flag. The base station receives the tag transmission in step 730, and decides whether to try again to write the lock bits in the case of a mistake or in case of a weak write.

In all cases, it is envisioned by the inventors that some commands from the base station are not necessary, and that a tag which is sufficiently "smart" will know that a LOCK command is always followed by a QUERY_LOCK command to query the lock status of the address sent with the lock command, or that a WRITE command is always followed by a READ-VERIFY command, or that a WRITE_BROADCAST command is always followed by a BROADCAST_UNSELECT command. The tag may then respond automatically by sending back the appropriate answer as if the command were actually sent from the base station.

We claim:

1. A method of writing data to a passive RF tag non-volatile memory, comprising;
   a) writing a signal to a tag volatile memory, the signal indicative that a tag supply voltage is sufficient to write the data to the tag non-volatile memory, the signal written before the data is written to the tag non-volatile memory; then
   b) changing the signal if the tag voltage becomes insufficient to write the data to the tag non-volatile memory during the time that the data is written to the tag non-volatile memory, wherein the signal is also changed to indicate that the tag voltage was insufficient each time that tag powers up from a state where the tag voltage was insufficient to run the tag electronics.

2. The method of claim 1, further comprising;
   c) communicating the signal from the tag to a base station.

3. The method of claim 1, further comprising;
   c) sending a command from a base station to the tag to verify the data; and
   d) sending the data from the tag to the base station only if the tag supply voltage was sufficient to write the data to the tag non-volatile memory during the time that the data was being written to the tag non-volatile memory.

4. The method of claim 1, further comprising;
- c) sending a command from a base station to the tag to verify the data;
- d) resending the data from the base station to the tag; and
- e) communicating from the tag to the base station if the tag supply voltage was insufficient to write the data to the tag non-volatile memory during the time that the data was being written to the tag non-volatile memory.

5. The method of claim 1, wherein the data written to the tag non-volatile memory is a lock status of data contained in the tag non-volatile memory, further comprising;
- c) sending a command from a base station to the tag to query the lock status of the data contained in the tag non-volatile memory;
- d) sending a status signal from the tag to the base station detailing whether the tag supply voltage was insufficient to write the data to the tag non-volatile memory at any time during the time that the lock status was being written to the tag non-volatile memory.

6. The method of claim 1, further comprising;
- c) changing the signal that the tag supply voltage is sufficient to write the data to the tag non-volatile memory, the signal changed when the tag first powers up.

7. A method of writing data to a passive RF tag non-volatile memory, comprising;
- a) comparing a defined percentage of a tag supply voltage to a stable reference voltage during the time that the data is being written to the tag non-volatile memory; and
- b) recording whether the defined percentage of the tag supply voltage is less than the stable reference voltage at any time during the time that the data is being written to the tag non-volatile memory.

8. The method of claim 7, further comprising;
- c) communicating the record produced in step b) from the tag to a base station.

9. The method of claim 7, further comprising;
- c) sending a command from a base station to the tag to verify the data; and
- d) sending the data from the tag to the base station only if the defined percentage of the tag supply voltage was never less than the stable reference voltage during the entire time that the data was being written to the tag non-volatile memory.

10. The method of claim 7, where the stable reference voltage is generated by a bandgap voltage generator.

11. The method of claim 7, further comprising;
- c) sending a command from a base station to the tag to verify the data;
- d) resending the data from the base station to the tag; and
- e) communicating from the tag to the base station if the defined percentage of the tag supply voltage was less than the tag reference voltage at any time during the time that the data was being written to the tag non-volatile memory.

12. The method of claim 7, wherein the data written to the tag non-volatile memory is a lock status of data contained in the tag non-volatile memory, further comprising;
- c) sending a command from a base station to the tag to query the lock status of the data contained in the tag non-volatile memory;
- d) sending a signal from the tag to the base station with information whether the defined percentage of the tag supply voltage was less than the stable reference voltage at any timne during the time that the lock status was written to the tag non-volatile memory.

13. The method of claim 7, further comprising;
recording that the defined percentage of the tag supply voltage is less than the stable reference voltage when the tag first powers up.

14. The method of claim 7, where the stable reference voltage is provided by a bandgap voltage generator.

15. The method of claim 7, where the stable reference voltage is provided by a diode drop circuit.

16. The method of claim 7, where the stable reference voltage is provided by an n-channel FET threshold voltage circuit.

17. The method of claim 7, where the stable reference voltage is provided by an n-mirror voltage source.

18. The method of claim 7, where the stable reference voltage is provided by the voltage controlling a voltage controlled oscillator, the oscillation frequency of the voltage controlled oscillator compared with a frequency standard.

19. A method of writing data to an RF tag memory, comprising:
- a) generating a signal indicative that a tag supply voltage is sufficient to write the data to the tag memory; then
- b) changing the signal if the tag voltage becomes insufficient to write the data to the tag memory during the time that the data is written to the tag memory, wherein the signal is also changed to indicate that the tag voltage was insufficient each time that tag powers up from a state where the tag voltage was insufficient to run the tag electronics.

20. The method of claim 19, further comprising:
- c) communicating the signal from the tag to a base station.

21. The method of claim 19, further comprising:
- c) sending a command from a base station to the tag to verify the data; and
- d) sending the data from the tag to the base station only if the tag supply voltage was sufficient to write the data to the tag memory during the time that the data was being written to the tag memory.

22. The method of claim 19, further comprising:
- c) sending a command from a base station to the tag to verify the data;
- d) resending the data from the base station to the tag; and
- e) communicating from the tag to the base station if the tag supply voltage was insufficient to write tke data to the tag memory during the time that the data was being written to the tag memory.

23. The method of claim 19, wherein the data written to the tag memory further comprises a lock status of data contained in the tag memory, the method further comprising:
- c) sending a command from a base station to the tag to query the lock status of the data contained in the tag memory;
- d) sending a status signal from the tag to the base station detailing whether the tag supply voltage was insufficient to write the data to the tag memory at any time during the time that the lock status was being written to the tag memory.

24. The method of claim 19, further comprising:
   c) changing the signal that the tag supply voltage is sufficient to write the data to the tag memory, the signal changed when the tag first powers up.

25. A method of writing data to a passive RF tag memory, comprising:
   a) comparing a defined percentage of a tag supply voltage to a stable reference voltage during the time that the data is being written to the tag memory; and
   b) recording whether the defined percentage of the tag supply voltage is less than the stable reference voltage at any time during the time that the data is being written to the tag memory.

26. The method of claim 25, further comprising:
   c) communicating the record produced in step b) from the tag to a base station.

27. The method of claim 25, further comprising:
   c) sending a command from a base station to the tag to verify the data; and
   d) sending the data from the tag to the base station only if the defined percentage of the tag supply voltage was never less than the stable reference voltage during the entire time that the data was being written to the tag memolry.

28. The method of claim 25, wherein the stable reference voltage is generated by a bandgap voltage generator.

29. The method of claim 25, further, comprising:
   c) sending a command from a base station to the tag to verify the data;
   d) resending the data from the base station to the tag; and
   e) communicating from the tag to the base station if the defined percentage of the tag supply voltage was less than the tag reference voltage at any time during the time that the data was being written to the tag memory.

30. The method of claim 25, wherein the data written to the tag memory further comprises a lock status of data contained in the tag memory, the method further comprising:
   c) sending a command from a base station to the tag to query the lock status of the data contained in the tag memory;
   d) sending a signal from the tag to the base station with information whether the defined percentage of the tag supply voltage was less than the stable reference voltage at any time during the time that the lock status was written to the tag memory.

31. The method of claim 25, further comprising:
   c) recording that the defined percentage of the tag supply voltage is less than the stable reference voltage when the tag first powers up.

32. The method of claim 25, wherein the stable reference voltage is provided by a diode drop circuit.

33. The method of claim 25, wherein the stable reference voltage is provided by an n-channel FET threshold voltage circuit.

34. The method of claim 25, wherein the stable reference voltage is provided by an n-mirror voltage source.

35. The method of claim 25, wherein the stable reference voltage is provided by the voltage controlling a voltage controlled oscillator, the oscillation frequency of the voltage controlled oscillator compared with a frequency standard.

36. A method of sending data from a base station to a radio frequency (RF) transponder (RF tag), the RF tag having a memory including a first memory portion and a second memory portion, the second memory portion including an "intention to write to memory" field, comprising:
   a) writing information in the second memory portion; then
   b) writing the data to the first memory portion; then
   c) checking whether the data was successfully written to the first memory portion; and then
   d) clearing the information from the second memory portion after successful writing the data to the first memory portion.

37. The method of claim 36, wherein the information written in the second memory portion comprises a single bit.

38. An RF tag, comprising:
   a first tag memory for holding data written to the tag;
   a second tag memory comprising an "intention to write to memory field", wherein the "intention to write to memory field" is written before the data is written to the first tag memory, and wherein the "intention to write to memory field" is cleared after successfully writing the data to the first tag memory.

39. The RF tag of claim 38, wherein the seeond tag memory comprises a single bit.

* * * * *